(12) United States Patent
Hwang et al.

(10) Patent No.: US 6,815,335 B2
(45) Date of Patent: Nov. 9, 2004

(54) METHOD FOR FORMING A CONTACT IN A SEMICONDUCTOR PROCESS

(75) Inventors: Jae-Seung Hwang, Gyeonggi-do (KR); Sung-Un Kwean, Gyeonggi-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/404,294

(22) Filed: Mar. 31, 2003

(65) Prior Publication Data

US 2004/0038524 A1 Feb. 26, 2004

(30) Foreign Application Priority Data

Aug. 7, 2002 (KR) .................................... 2002-0046613

(51) Int. Cl.⁷ .......................................... H01L 21/4763
(52) U.S. Cl. ...................... 438/624; 438/634; 438/636; 438/637; 438/638; 438/649
(58) Field of Search ................................ 438/624, 634, 438/636–638, 649; 257/751, 754, 755, 760, 774, 775

(56) References Cited

U.S. PATENT DOCUMENTS 5,719,089 A * 2/1998 Cherng et al. .............. 438/637
6,191,046 B1 * 2/2001 Singh et al. ................. 438/723
6,579,809 B1 * 6/2003 Yang et al. .................. 438/734

FOREIGN PATENT DOCUMENTS

KR 10-0280622 11/2000

OTHER PUBLICATIONS

English language abstract of Korea Publication No. 10-0280622.

* cited by examiner

Primary Examiner—Hsien Ming Lee
(74) Attorney, Agent, or Firm—Marger Johnson & McCollom, P.C.

(57) ABSTRACT

After an etching stop layer and an interlayer dielectric film are formed on a semiconductor substrate including a contact formation portion, a polysilicon film and a anti-reflective layer are successively formed on the interlayer dielectric film. A second mask pattern exposing the polysilicon film is formed after etching the anti-reflective layer exposed through a first mask pattern. A third mask pattern is formed by attaching polymer on a sidewall of the second mask pattern. A contact hole exposing the contact formation portion is formed by etching the polysilicon film and the interlayer dielectric film using the third mask pattern as an etching mask. A conductive material is filled in the contact hole to form the contact. By attaching the polymer to the second mask pattern, a contact hole with a minute size can be formed.

32 Claims, 16 Drawing Sheets

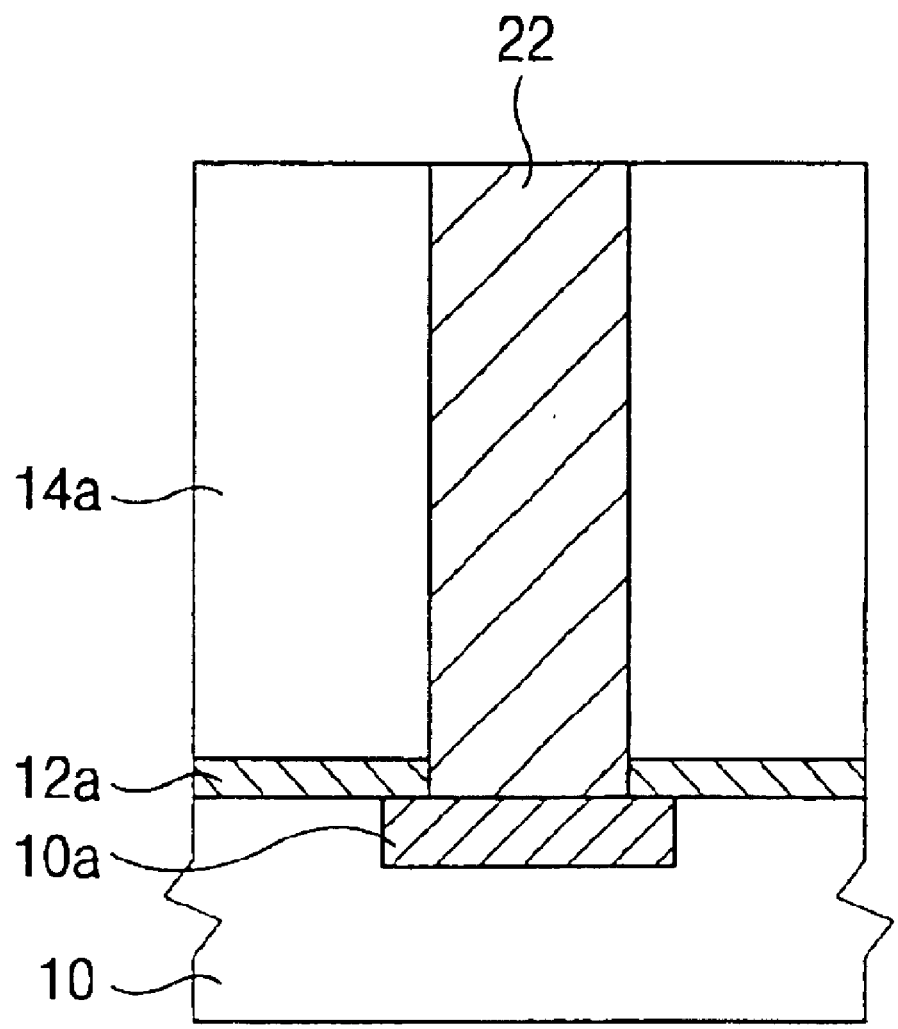

METHOD FOR FORMING A CONTACT IN A SEMICONDUCTOR PROCESS

CROSS REFERENCE TO RELATED APPLICATIONS

This application claims benefit of priority under 35 USC § 119 to Korean Patent Application No. 2002-46613, filed on Aug. 7, 2002, the contents of which are hereby incorporated by reference in their entirety.

BACKGROUND OF THE INVENTION

1. Field of the Invention

The present invention relates to a method for forming a contact in a semiconductor process, and more particularly to a method for forming a contact in a semiconductor device of minute size.

2. Description of the Related Art

Highly integrated semiconductor devices are required to maintain pace with today's rapidly developing information society. As a result, the dimensions of the electrical wiring in a semiconductor device tends to become increasingly miniaturized, exhibiting a multi-layered construction. To achieve electrical connection between the wirings of the semiconductor device, contacts are necessary.

FIGS. 1A to 1E are cross-sectional views illustrating a conventional method for forming a contact in a semiconductor device.

Referring to FIG. 1A, an etching stop layer 12 having a thickness of approximately 100 to 2,000 Å is formed on a semiconductor substrate 10 including the portion 10a for the formation of a contact. An interlayer dielectric film 14 is formed on the etching stop layer 12. In this case, the portion 10a for the formation of the contact can include the upper face of a gate electrode, a source, or a drain. Also, the portion 10a for the contact may correspond to the surface of a contact plug.

Referring to FIG. 1B, an anti-reflective layer 16 is formed on interlayer dielectric film 14 to prevent scattering of light from the underlying films during a successive photolithography process. Then, a photoresist pattern 18 is formed on the anti-reflective layer 16. The photoresist pattern 18 opens the portion of the anti-reflective layer 16 corresponding to the portion 10a for the formation of the contact.

Referring to FIG. 1C, portions of the anti-reflective layer 16 and the interlayer dielectric film 14 are successively etched by using the photoresist pattern 18 as an etching mask until the etching stop layer 12 is exposed.

The photoresist pattern 18 is removed through a stripping process. The exposed etching stop layer 12 is etched so that a contact hole 20 exposing the portion 10a for the formation of the contact is formed, resulting in FIG. 1D. When the etching stop layer 12 is etched, the anti-reflective layer 16 is simultaneously removed.

Referring to FIG. 1E, a conductive material is filled in the contact hole 20 to form the contact 22.

According to the conventional method, the size of the contact is determined by means of the photolithography process executed in order to form the photoresist pattern. However, the smallest size of the contact hole may be limited because the photoresist pattern may not be formed to have extremely minute dimensions throughout a photolithography process. In particular, contact holes of recent semiconductor devices are required to have sizes below approximately 100 nm, but a contact hole of this size is difficult to form using conventional processes.

To form a contact smaller than that of the photoresist pattern provided by conventional means, a method has been suggested wherein an additional photoresist re-flow process is performed to flow the photoresist onto the sidewall of the photoresist pattern after the photoresist pattern is formed, as shown in FIG. 1B. However, because the photoresist lacks uniform flow on each region of the semiconductor substrate, the contacts are not the same size over the entire region of the substrate. Specifically, the contacts may have a relatively smaller size in regions where the contacts are closely arranged because the flow rate of the photoresist in those regions is greater than that of the photoresist in the region where the contacts are relatively widely dispersed.

In order to form a contact having minute size, a slant-etching method wherein the upper portion of the contact hole has a larger diameter than that of the lower portion of the contact hole has been suggested. However, the etching rate may be slower when a larger size contact is formed even though an identical film is etched for forming the contact hole through the slant etching process. Hence, a relatively large contact hole may be less etched to produce the contact non-open failure or a relatively small contact hole may be over-etched when contact holes of different sizes are formed in the same regions of the substrate with one etching process.

In order to solve the above-mentioned problem, U.S. Pat. No. 5,719,089 discloses a method for forming a contact hole by etching an insulation film while a polymer is formed on a mask pattern including a polysilicon pattern and a photoresist pattern. However, with this method, the contact may not have the desired size since the thickness of the polymer attached to the contact hole may be hard to control.

SUMMARY OF THE INVENTION

The invention solves the afore-mentioned problems and accordingly, it is an object of the invention to provide a method for forming a contact of a semiconductor device having a minute size.

According to an embodiment of the invention, in order to achieve this and other objects, a method is provided for forming a contact of a semiconductor device that includes the following steps. After forming an interlayer dielectric film on a semiconductor substrate including a portion for the formation of a contact, a polysilicon film and an anti-reflective layer are successively formed on the interlayer dielectric film. A first mask pattern is formed on the anti-reflective layer. The first mask pattern includes a first opened portion corresponding to the portion for the formation of the contact. A second mask pattern exposing the polysilicon film is formed via etching the anti-reflective layer exposed through the first mask pattern. A third mask pattern is formed by attaching polymer on a sidewall of the second mask pattern. The third mask pattern includes a second opened portion smaller than the first opened portion. A contact hole exposing the portion for the formation of the contact is formed via etching the polysilicon film and the interlayer dielectric film using the third mask pattern as an etching mask. Then, the contact hole is filled with a conductive material.

To achieve the objects of the invention, according to another embodiment, a method is provided for forming a contact of a semiconductor device comprising the following steps. After successively forming an etching stop layer and an interlayer dielectric film on a semiconductor substrate including a portion for the formation of a contact, a polysilicon film and an anti-reflective layer are successively formed on the interlayer dielectric film. A first mask pattern is formed on the anti-reflective layer. The first mask pattern includes a first opened portion corresponding to the portion for the formation of the contact. A second mask pattern exposing the polysilicon film is formed by etching the anti-reflective layer exposed through the first mask pattern. A third mask pattern is formed by attaching polymer on a sidewall of the second mask pattern. The third mask pattern includes a second opened portion smaller than the first opened portion. After etching the polysilicon film and the interlayer dielectric film using the third mask pattern as an etching mask to expose the etching stop layer, a contact hole exposing the portion for the formation of the contact is formed by etching the exposed etching stop layer while the anti-reflective layer remains on the polysilicon film. Then, the contact hole is filled with a conductive material.

To achieve objects of the invention according to yet another embodiment, a method is provided for forming a contact of a semiconductor device comprising the following steps. After forming an interlayer dielectric film on a semiconductor substrate including a portion for the formation of a contact, a polysilicon film and an anti-reflective layer are successively formed on the interlayer dielectric film. A first mask pattern is formed on the anti-reflective layer. The first mask pattern includes a first opened portion corresponding to the portion for the formation of the contact. A second mask pattern exposing the polysilicon film is formed by etching the anti-reflective layer exposed through the first mask pattern. A third mask pattern is formed by attaching polymer on a sidewall of the second mask pattern. The third mask pattern includes a second opened portion smaller than the first opened portion. After forming a contact hole exposing the portion for the formation of the contact by etching the polysilicon film and the interlayer dielectric film using the third mask pattern as an etching mask to expose the etching stop layer, films remaining on the interlayer dielectric film are removed. Then, the contact hole is filled with a conductive material.

According to the present invention, the polymer is attached to the sidewall of the second mask pattern, and the contact hole is formed using the third mask pattern where the polymer is attached as the etching mask. Therefore, the contact hole can have a smaller size than that of the contact provided by conventional photolithography processes. Additionally, the size of the contact hole can be adjusted by controlling the thickness of the polymer attached to the second mask pattern.

BRIEF DESCRIPTION OF THE DRAWINGS

The above and other objects and advantages of the invention will become readily apparent by reference to the following detailed description when considered in conjunction with the accompanying drawings.

FIG. 1E is a cross-sectional diagram illustrating a conventional method for filling the contact hole of FIG. 1D with a conductive material to form a contact.

DETAILED DESCRIPTION OF THE INVENTION

Hereinafter, the preferred embodiments of the invention will be described in detail with reference to the accompanying drawings.

FIGS. 2A to 2K are cross-sectional views illustrating the method for forming the contact of a semiconductor device according to an embodiment of the invention.

Figure 1A:
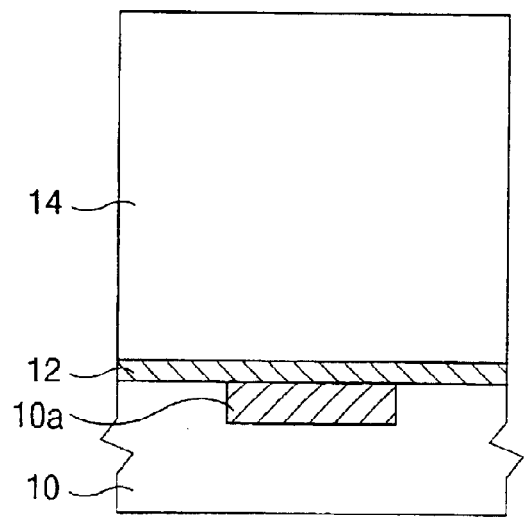
FIG. 1A is a cross-sectional diagram illustrating a conventional method for forming an etching stop layer and an interlayer dielectric film on a substrate.
Figure 1B:
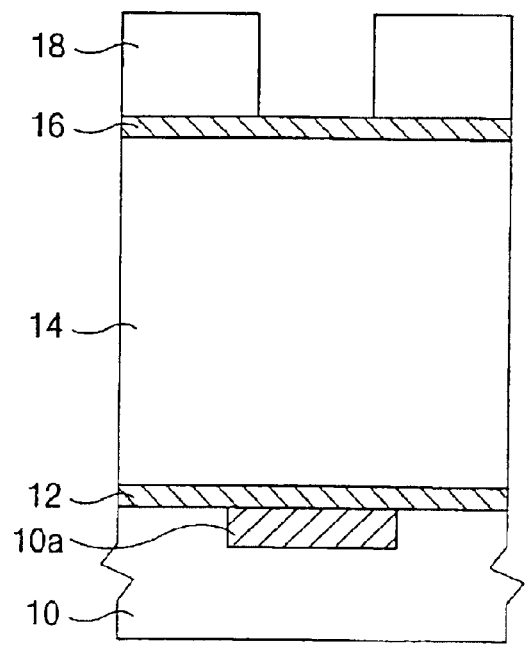
FIG. 1B is a cross-sectional diagram illustrating a conventional method for forming an anti-reflective layer and a photoresist pattern on the structure of FIG. 1A.
Figure 1C:
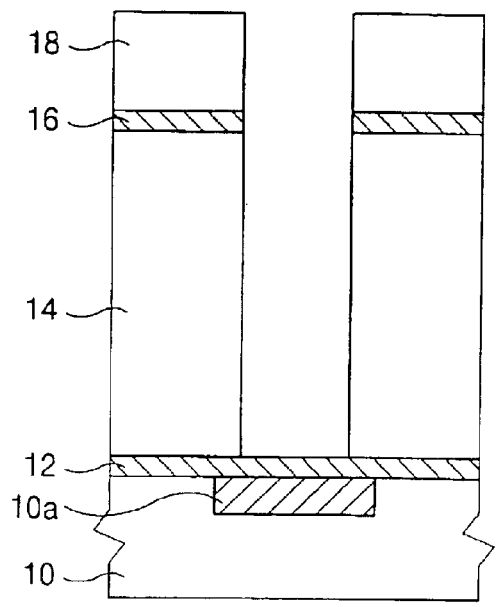
FIG. 1C is a cross-sectional diagram illustrating a conventional method for etching the anti-reflective layer and the interlayer dielectric film of FIG. 1B using the photoresist pattern as an etching mask.
Figure 1D:
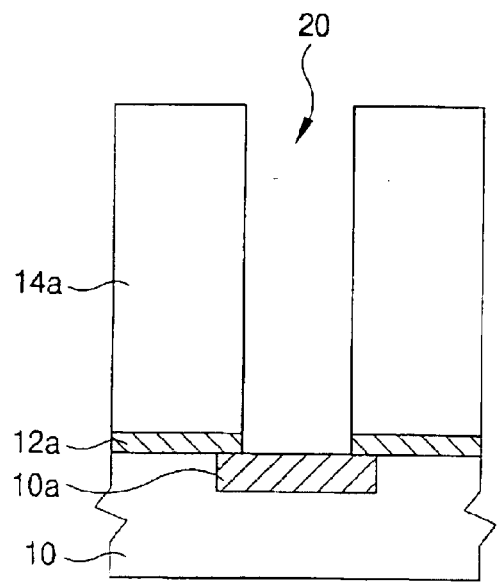
FIG. 1D is a cross-sectional diagram illustrating a conventional method for forming a contact hole in the structure of FIG. 1C by removing the photoresist pattern an etching the etching stop layer.
Figure 2A:
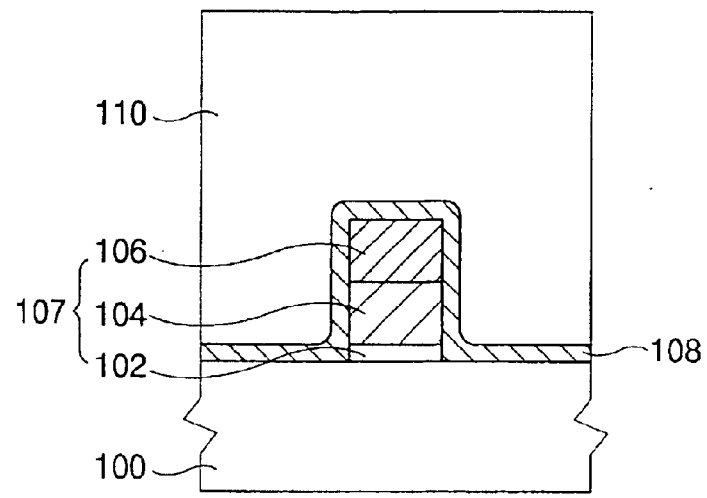
FIG. 2A is a cross-sectional diagram illustrating a method of forming etching stop layer and an interlayer dielectric film on a substrate according to an embodiment of the invention.

Referring to FIG. 2A, an etching stop layer 108 having a thickness of approximately 100 to 2,000 Å is formed on a semiconductor substrate 100 including a portion for the formation of a contact. However, the etching stop layer 108 is not formed on the substrate 100 in accordance with the etching selectivity between the portion for the formation of the contact and a successively formed interlayer dielectric film.

The interlayer dielectric film 110 is formed on the etching stop layer 108. In this case, the portion for the formation of the contact can include a metal silicide film, a silicon film, or a metal film. In the semiconductor device, the portion for the contact may also include the upper face of a gate electrode, a source region or a drain region. Also, the portion for the contact may correspond to the surface of a contact plug.

In this embodiment, the portion for the contact corresponds to the upper face of the gate electrode of a transistor. In detail, an oxide film is formed on a substrate through a thermal oxidation process. A polysilicon film doped with impurities and a metal silicide film are successively formed on the oxide film as a gate oxide film. The metal silicide film includes at least one material from the group consisting of tungsten silicide ($WSi_x$), tantalum silicide ($TaSi_2$), molybdenum silicide ($MoSi_2$), and cobalt silicide ($CoSi_x$).

A silicon nitride (SiN) is deposited on the metal silicide film through a low pressure chemical vapor deposition (LPCVD) process such that an anti-reflective layer having a thickness of approximately 800 Å is formed on the metal silicide film. The anti-reflective layer can prevent light reflection from the substrate during a successive photolithography process, thereby easily forming a photoresist pattern on the substrate.

After the photoresist pattern is formed on the anti-reflective layer, the anti-reflective layer is patterned to form a gate pattern by using the photoresist pattern as an etching mask. The photoresist pattern is removed, and then the metal silicide film, the poly silicon film and the oxide film are successively etched using the patterned anti-reflective layer as an etching mask by a dry etching process. Thus, a gate electrode 107 including a gate oxide film 102, a poly silicon pattern 104, and a metal silicide pattern 106 is formed on the semiconductor substrate 100.

Then, the etching stop layer 108 having a thickness of approximately 100 to 2,000 Å is formed on the semiconductor substrate 100 including the gate electrode 107 formed thereon. The etching stop layer 108 is formed with a high etching selectivity relative to the interlayer dielectric film 110 so that the etching process for etching the predetermined portion of the interlayer dielectric film 110 is stopped when the etching stop layer 108 is exposed. Particularly, the etching stop layer 108 can be formed with silicon nitride (SiN).

Subsequently, the interlayer dielectric film 110 is formed on the etching stop layer 108 to cover the gate electrode 107. The interlayer dielectric film 110 can include silicon oxide.

Figure 2B:
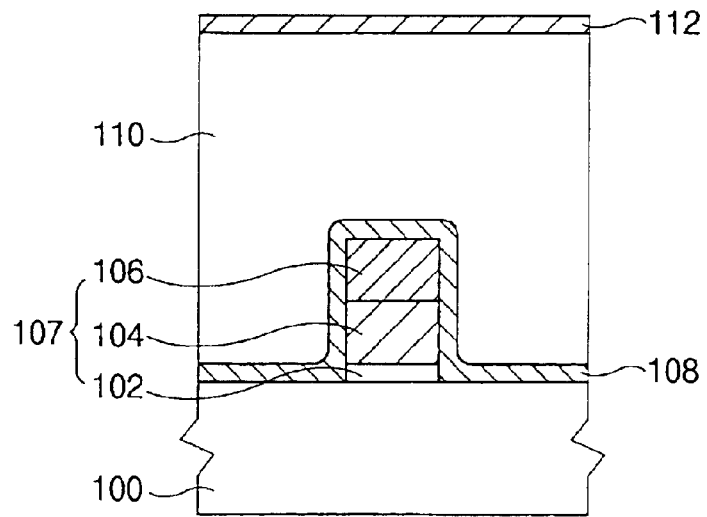
FIG. 2B is a cross-sectional diagram illustrating a method of forming polysilicon film on the structure of FIG. 2A according to an embodiment of the invention

Referring to FIG. 2B, a polysilicon film 112 is formed on the interlayer dielectric film 110. The polysilicon film 112 protects the underlying films when a polymer is attached thereto during a successive process for attaching the polymer. Thus, the polysilicon film 112 has a sufficient thickness such that the polysilicon film 112 is not completely consumed when the polymer of a desired thickness is later attached. Specifically, the polysilicon film 112 has a thickness of approximately 100 to 2,000 Å. When the polysilicon film 112 has a thickness below approximately 100 Å, the polysilicon film 112 may be completely consumed during the attachment of the polymer. On the other hand, when the polysilicon film 112 has a thickness of more than approximately 2,000 Å, the polysilicon film 112 is relatively unaffected and the time required for the semiconductor manufacturing process may be increased.

Figure 2C:
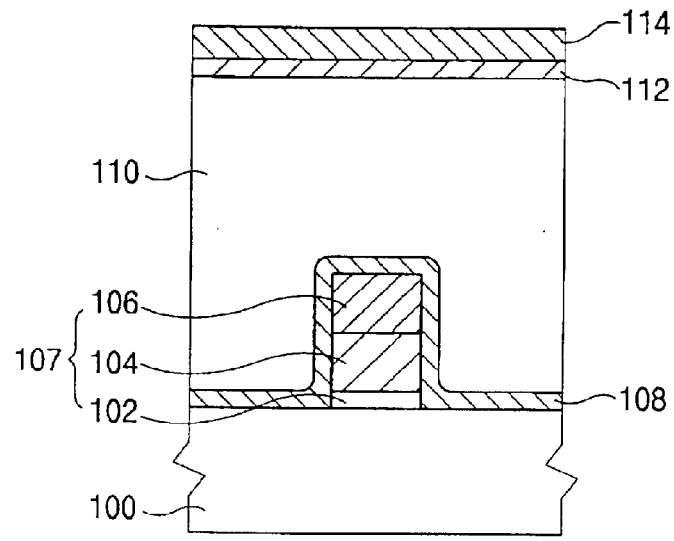
FIG. 2C is a cross-sectional diagram illustrating a method of forming anti-reflective layer on the structure of FIG. 2B according to an embodiment of the invention.

Referring to FIG. 2C, an anti-reflective layer 114 is formed on the polysilicon film 112 in order to prevent light scattering from the underlying films during a successive photolithography process. The anti-reflective layer 114 has a thickness greater than that of the etching stop layer 108. Preferably, the anti-reflective layer 114 has a thickness of approximately 30 to 2,000 Å. The thickness of the anti-reflective layer 114 is thicker than that of the etching stop layer 108 by more than approximately 30 Å. Additionally, the anti-reflective layer 114 can include silicon oxy-nitride (SiON).

Figure 2D:
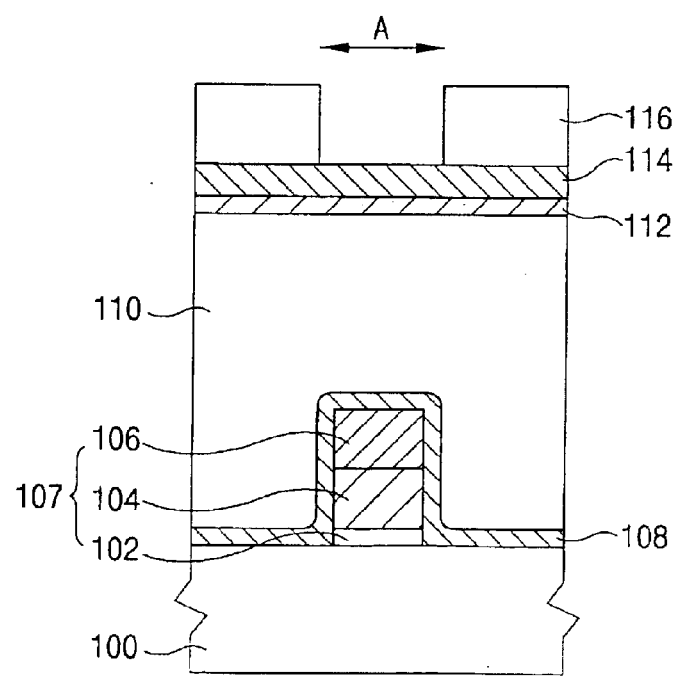
FIG. 2D is cross-sectional diagram illustrating a method of forming a photoresist pattern on the structure of FIG. 2C according to an embodiment of the invention.

Referring to FIG. 2D, a photoresist pattern 116 is formed on the anti-reflective layer 114. The photoresist pattern 116 opens the portion of the anti-reflective layer 114 corresponding to the portion for the formation of the contact. Namely, the portion of the anti-reflective layer 114 over the gate electrode 107 is opened by the photoresist pattern 116. In detail, a photoresist film is coated on the anti-reflective layer 114. The portion of the photoresist film corresponding to the gate electrode 107 is exposed and developed so that the photoresist pattern 116 is formed on the anti-reflective layer 114. Hence, a first opened region A of the photoresist pattern 116 corresponds to the gate electrode. In this case, the size of the first opened region A can be greater than the length of the gate electrode 107 positioned under the first opened region A.

Figure 2E:
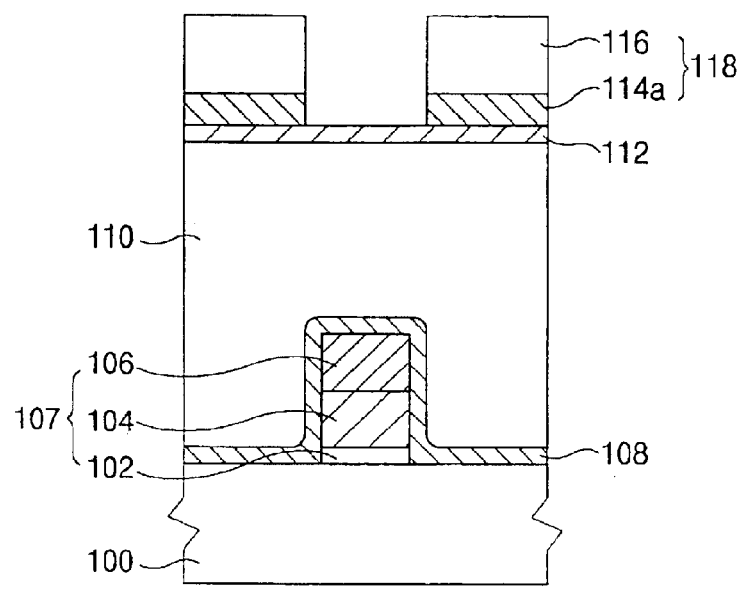
FIG. 2E is a cross-sectional diagram illustrating a method of forming a preliminary etching mask pattern on the structure of FIG. 2D according to an embodiment of the invention.

Referring to FIG. 2E, the portion of the anti-reflective layer 114 exposed through the first opened region A is etched using the photoresist pattern 116 as an etching mask, thereby forming a preliminary etching mask pattern 118 that exposes the polysilicon film 112. The preliminary etching mask pattern 118 includes an anti-reflective layer pattern 114a and the photoresist pattern 116.

Figure 2F:
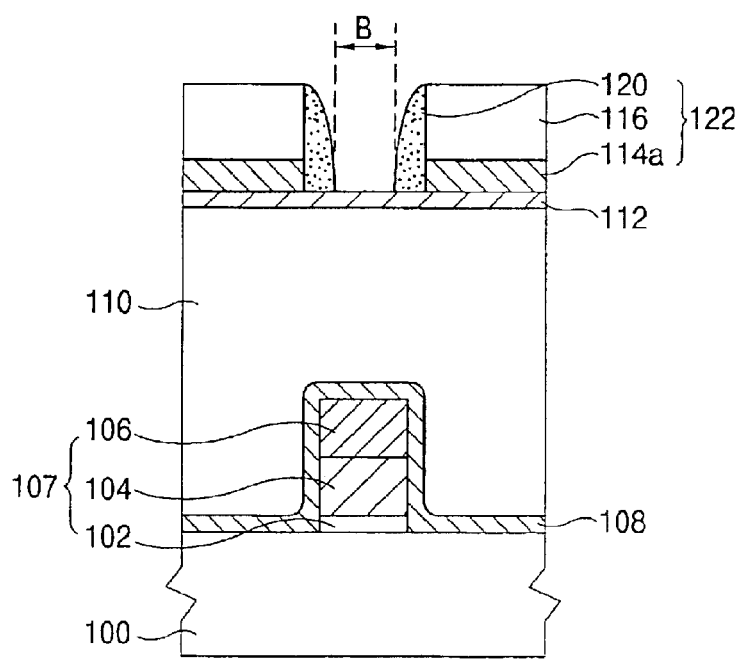
FIG. 2F is a cross-sectional diagram illustrating a method of forming a polymer on a sidewall of the preliminary etching mask pattern of FIG. 2E according to an embodiment of the invention.

Referring to FIG. 2F, the polymer 120 is attached to the sidewall of the preliminary etching mask pattern 118, so that etching mask pattern 122 having a second opened region B is formed. The second opened region B has a width narrower than that of the first opened region A because the polymer 120 is formed on the sidewall of the preliminary etching mask pattern 118.

In the process for attaching the polymer 120 on the sidewall of the preliminary etching mask pattern 118, a gas containing $CH_xF_y$ (wherein x and y are positive numbers) or a mixture of gas including $CH_xF_y$ is reflowed onto the substrate 100 where the preliminary etching mask pattern 118 is formed. Examples of the gas containing $CH_xF_y$ include a $CH_2F_2$ gas, a $CH_2F_3$ gas, or a $CHF_3$ gas. Also, the mixture of gas can include a $HeO_2$ gas or a $Cl_2$ gas. When the process for attaching the polymer 120 is performed with the above-mentioned gas, the polymer 120 is attached on the sidewall of the preliminary etching mask pattern 118 while the exposed polysilicon film 112 is hardly etched. If the exposed polysilicon film 112 and the interlayer dielectric film 110 are etched during the process for attaching the polymer 120 on the sidewall of the preliminary etching mask pattern 118, the polymer 120 attached to the sidewall of the preliminary etching mask pattern 118 may not have the desired thickness. However, according to this embodiment, the time required for attaching the polymer 120 can be advantageously controlled so that the polymer 120 has the desired thickness because the polysilicon film 112 is not etched during the process for attaching the polymer 120 on the sidewall of the preliminary etching mask pattern 118.

The second opened region B of etching mask pattern 112 has a smaller size than that of the first opened region A of the photoresist pattern 116 due to the formation of the polymer 120. That is, the width of the second opened region B is reduced by the thickness of the polymer 120 in comparison with the width of the first opened region A. Therefore, the etching mask pattern 122 has a second opened region B narrower than first opened region A of the photoresist pattern 116 corresponding to the narrowest region that can be formed by the photolithography process.

Figure 2G:
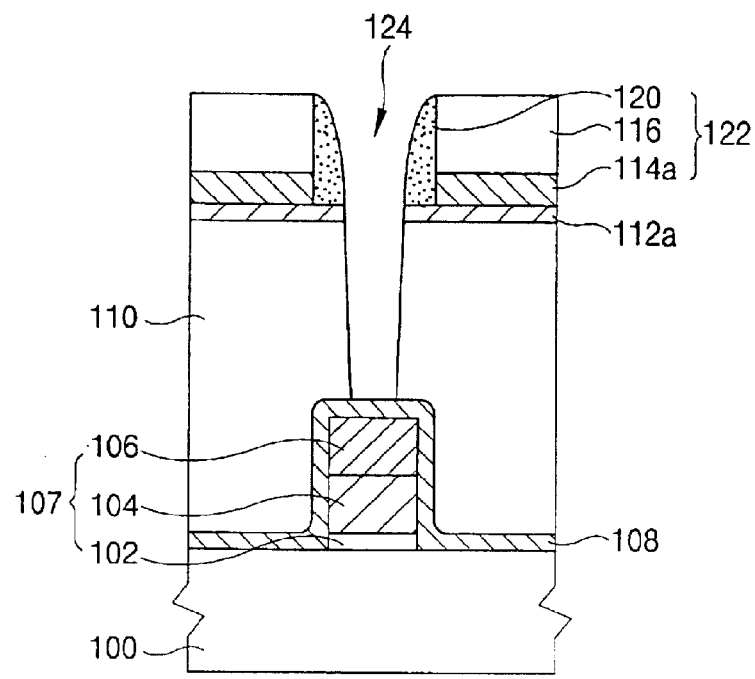
FIG. 2G is a cross-sectional diagram illustrating a method of forming a preliminary contact hole in the structure of FIG. 2F according to an embodiment of the invention.

Referring to FIG. 2G, the portions of the polysilicon film 112a and the interlayer dielectric film 110 are successively etched by using the etching mask pattern 122 until the etching stop layer 108 is exposed, so a preliminary contact hole 124 is formed to partially expose the etching stop layer 108. In this case, the preliminary contact hole 124 has a size smaller than that of the first opened region A of the photoresist pattern 116.

Figure 2H:
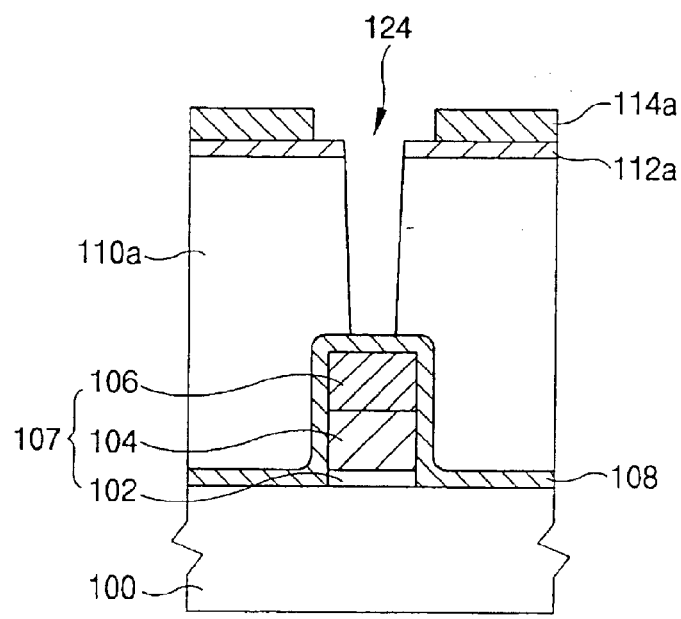
FIG. 2H is a cross-sectional diagram illustrating a method of removing the photoresist pattern and the polymer from the structure of FIG. 2G according to an embodiment of the invention.

Referring to FIG. 2H, the photoresist pattern 116 and the polymer 120 attached on the sidewall of the preliminary etching mask pattern 118 are removed through an ashing process. The photoresist pattern 116 and the polymer 120 are preferably removed in a successive process. When the photoresist pattern 116 and the polymer 120 are not removed immediately after the formation of the preliminary contact hole 124, the portion of the etching stop layer 108 exposed through the preliminary contact hole 124 may not be normally etched during a successive etching process. Particularly, polymers may be attached on the upper face of the etching stop layer 108 during the etching process for forming the preliminary contact hole 124. Because the polymers attached on the upper face of the etching stop layer 108 may be hardly removed when the etching stop layer 108 is etched, a non-open of the contact or a failure of the contact resistance may occur in a semiconductor device process.

Figure 2I:
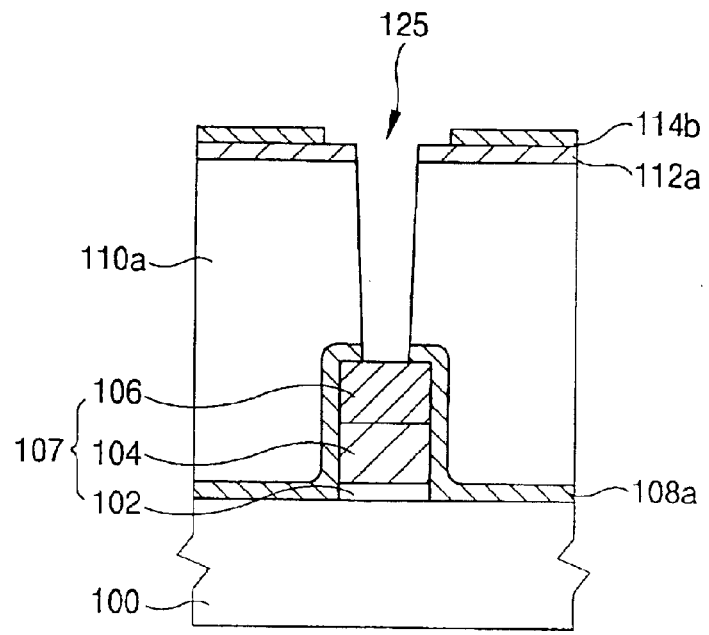
FIG. 2I is a cross-sectional diagram illustrating a method of forming a contact hole in the structure of FIG. 2H according to an embodiment of the invention.

Referring to FIG. 2I, the exposed etching stop layer 108a is etched while the anti-reflective layer 114b remains on the polysilicon film 112a such that a contact hole 125 is formed to expose the upper face of the gate electrode 107.

When the etching stop layer 108a is etched, the anti-reflective layer 114b is simultaneously etched. Because the anti-reflective layer 114b is thicker than the etching stop layer 108a by more than approximately 100 Å, the anti-reflective layer 114b remains on the polysilicon film 112a when the etching stop layer 108a is completely etched. The remaining anti-reflective layer 114b preferably has a thickness of approximately 30 to 1,500 Å. If the remaining anti-reflective layer 114b has a thickness of below approximately 30 Å, the anti-reflective layer 114b may be partially removed. On the other hand, the anti-reflective layer 114b may be hardly removed in a successive process when the remaining anti-reflective layer 114b has a thickness of more than approximately 1,500 Å.

In cases where the etching stop layer 108 is not formed on the gate electrode 107 in FIG. 2A, the process for etching the etching stop layer 108 is not required. Additionally, instead of the process for etching the etching stop layer 108a, the anti-reflective layer 114b may be partially etched while the anti-reflective layer 114b remains on the polysilicon film 112a, thereby thinning a thickness of the anti-reflective layer 114b.

Figure 2J:
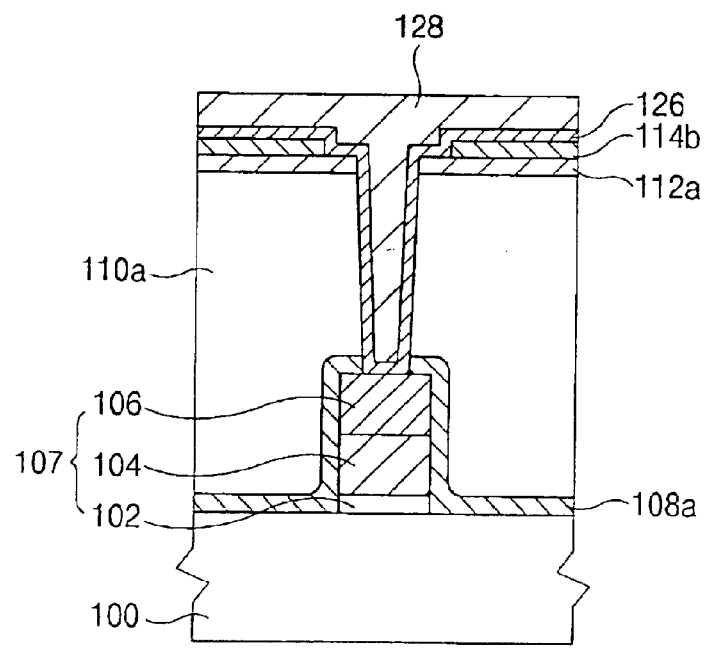
FIG. 2J is a cross-sectional diagram illustrating a method of forming a barrier metal layer on the structure of FIG. 2I according to an embodiment of the invention.

Referring to FIG. 2J, a barrier metal layer 126 is uniformly formed on the surfaces of the contact hole 125, the polysilicon film 112a, and the anti-reflective layer 114b. The barrier metal layer 126 prevents a conductive material filled in the contact hole 125 from diffusing into the interlayer dielectric film 110a. The barrier metal layer 126 may be a titanium film, a titanium nitride film, a tantalum film, a tantalum nitride film or a composite film formed from a combination of these materials. However, the barrier metal layer 126 may rapidly react with the polysilicon film 112a so that a reaction film including metal silicide may partially form on the polysilicon film 112a. The reaction film is only slightly affected by the dry etching process and may serve as a particle source causing a process failure to occur. In this embodiment, because the anti-reflective layer 114b remains on the polysilicon film 112a, the polysilicon film 112a is hardly exposed when the barrier metal layer 126 is formed. Thus, the reaction film does not form.

A metal layer 128 is formed on the barrier metal layer 126 to fill up the contact hole 125. The metal layer 128 can include tungsten (W), aluminum (Al), or copper (Cu).

Figure 2K:
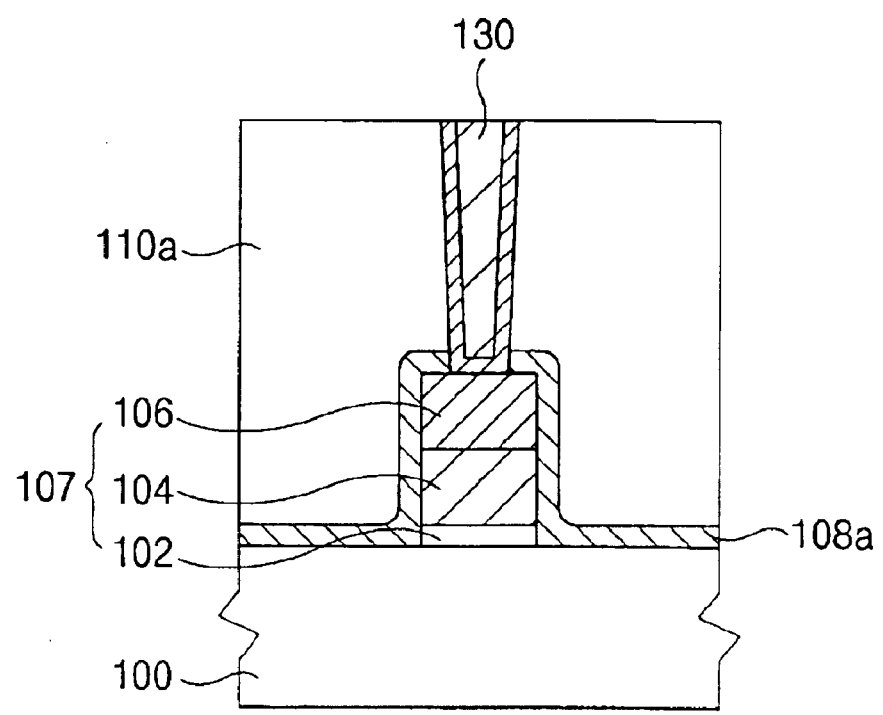
FIG. 2K is a cross-sectional diagram illustrating a method of polishing the structure of FIG. 2J according to an embodiment of the invention.

Referring to FIG. 2K, the metal layer 128, the barrier metal layer 126 and the anti-reflective layer 114b are successively polished until the polysilicon film 112a is exposed. At that time, the polishing process is executed when the polishing rate of the metal layer 128 is at least ten times faster than that of the polysilicon film 112a. Thus, the polishing process can be performed until the polysilicon film 112a is exposed because the polysilicon film 112a is not substantially polished during the polishing process.

Then, the exposed polysilicon film 112a is etched through the dry etching process, thereby forming the contact 130 in electrical contact with the gate electrode 107. When the polysilicon film 112a is etched, the metal layer 128 is exposed at the surface of the contact 130. Hence, at that time the etching rate of the polysilicon film 112a is at least five times faster than that of the metal layer 128 such that the polysilicon film 112a is completely etched while the metal layer 128 is not over-etched. The polysilicon film 112a can be etched using a gas including Cl$_2$ and HBr.

Besides the above-described process for the formation of the contact 130, another etching process can be performed with the etching rates of the metal layer 128 and the barrier metal layer 126 nearly identical to those of the anti-reflective layer 114b and the polysilicon film 112a in order to form a contact 130 that is electrically connected to the gate electrode 107.

FIGS. 3A to 3L are cross-sectional views illustrating a method for forming the contact of the semiconductor device according to another embodiment of the invention.

Figure 3A:
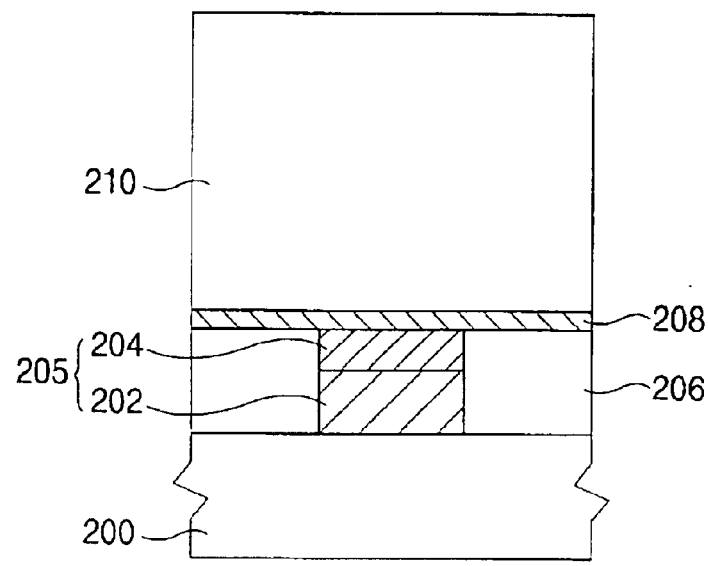
FIG. 3A is a cross-sectional diagram illustrating a method of forming etching stop layer and an interlayer dielectric layer on a substrate according to another embodiment of the invention.

Referring to FIG. 3A, an etching stop layer 208 having a thickness of approximately 100 to 2,000 Å is formed on a semiconductor substrate 200 including the portion for the formation of a contact. The etching stop layer 208 may not be formed on the semiconductor substrate 200 in accordance with the etching selectivity between the portion for the formation of the contact and an interlayer dielectric film successively formed.

The interlayer dielectric film 210 is formed on the etching stop layer 208. The portion for the formation of the contact can include a metal silicide film or a metal film. In the semiconductor device, the portion for the contact may also include the upper face of a gate electrode, a source region, or a drain region. Also, the portion for the formation of the contact may correspond to the surface of a contact plug.

In this embodiment, the portion for the formation of the contact corresponds to the upper face of a metal silicide pattern. In particular, a polysilicon film 202 doped with impurities and a metal silicide film 204 are successively formed on the substrate 200. The metal silicide film 204 may include tungsten silicide (WSi$_x$), tantalum silicide (TaSi$_2$), molybdenum silicide (MoSi$_2$) or cobalt silicide (CoSi$_x$).

After an anti-reflective layer and a photoresist pattern are formed on the metal silicide film 204, the anti-reflective layer is etched using the photoresist pattern as an etching mask. The photoresist pattern is removed, and then the metal silicide film 204 and the polysilicon film 202 are successively etched using the anti-reflective layer as an etching mask, thereby forming a conductive pattern 205 including the metal silicide film 204 and the polysilicon film 202. During the formation of the conductive pattern 205, the anti-reflective layer is substantially removed.

After an insulation film 206 is formed to cover the conductive pattern 205, the insulation film 206 is polished to expose the metal silicide film 204 corresponding to the upper portion of the conductive pattern 205. In this case, the exposed surface of the metal silicide film 204 corresponds to the portion for the formation of the contact.

Then, the etching stop layer 208 having a thickness of approximately 100 to 2,000 Å is formed on the semiconductor substrate 200 including the conductive pattern 205 formed thereon.

The interlayer dielectric film 210 is formed on the etching stop layer 208. The interlayer dielectric film 210 can include silicon oxide.

Figure 3B:
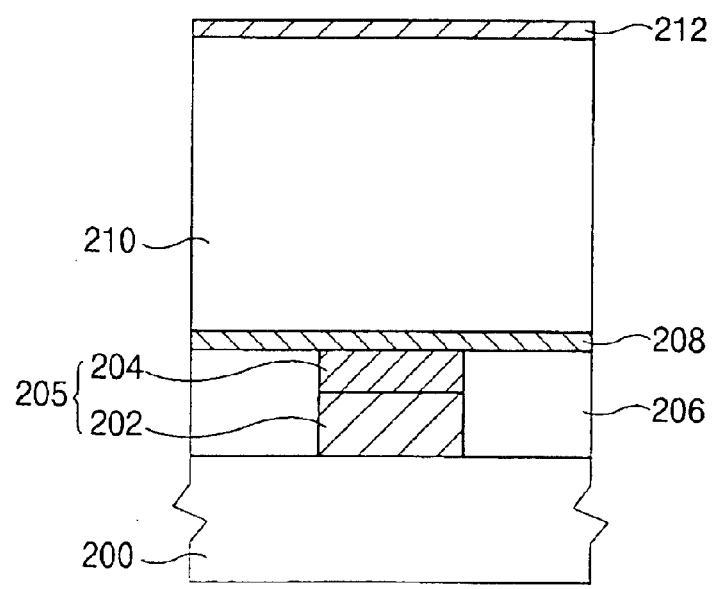
FIG. 3B is a cross-sectional diagram illustrating a method of forming a polysilicon film on the structure of FIG. 3A according to another embodiment of the invention.

Referring to FIG. 3B, a polysilicon film 212 is formed on the interlayer dielectric film 210. The polysilicon film 212 protects the underlying films when a polymer is attached thereto. The polysilicon film 212 has a thickness of approximately 100 to 2,000 Å.

Figure 3C:
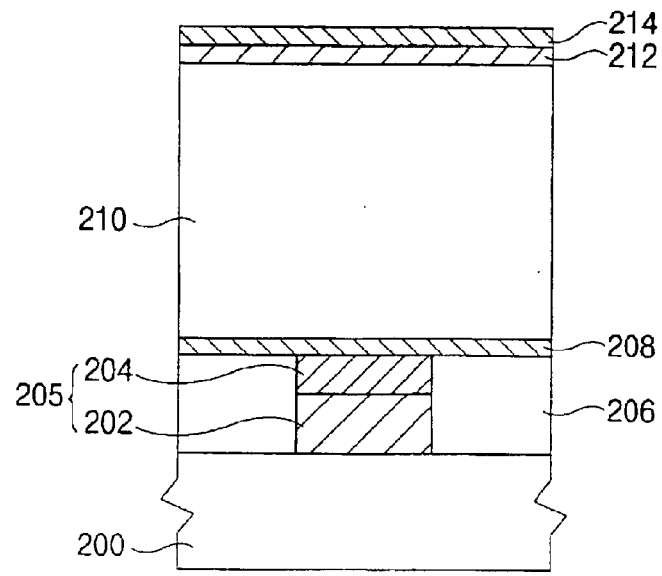
FIG. 3C is a cross-sectional diagram illustrating a method of forming anti-reflective layer on the structure of FIG. 3B according to another embodiment of the invention.

Referring to FIG. 3C, an anti-reflective layer 214 is formed on the polysilicon film 212 in order to prevent light scattering from the underlying films during a successive photolithography process. The anti-reflective layer 214 can include silicon oxy-nitride (SiON). Though the thickness of the anti-reflective layer 214 is not limited, preferably it has a thickness to efficiently prevent the light from scattering.

Figure 3D:
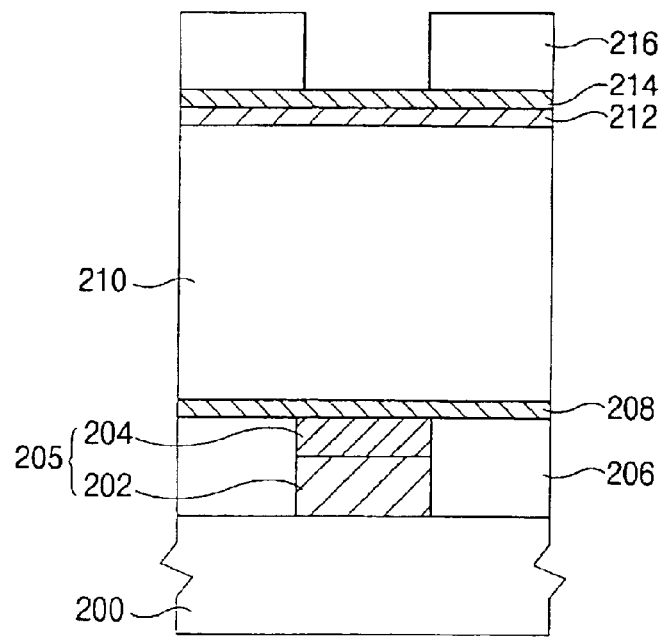
FIG. 3D is cross-sectional diagram illustrating a method of forming a photoresist pattern on the structure of FIG. 3C according to another embodiment of the invention.

Referring to FIG. 3D, a photoresist pattern 216 is formed on the anti-reflective layer 214. The photoresist pattern 216 opens the portion of the anti-reflective layer 214 corresponding to the portion for the formation of the contact.

Figure 3E:
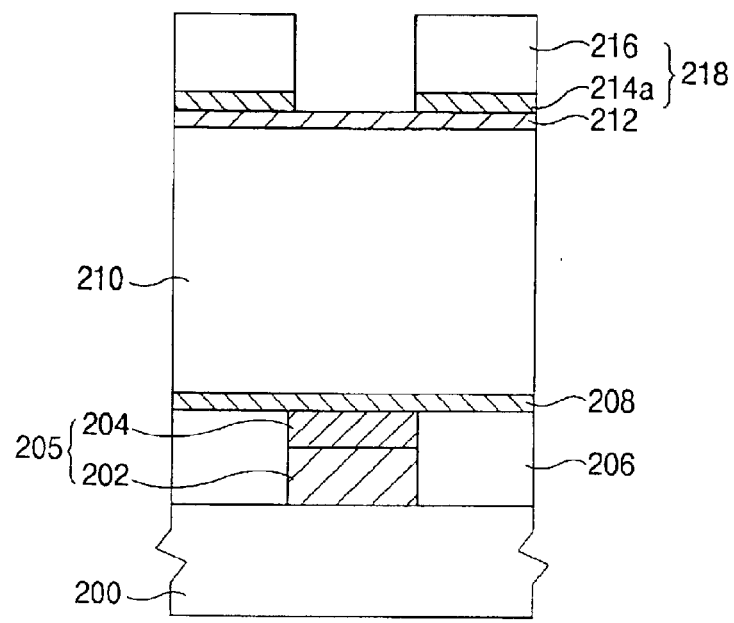
FIG. 3E is a cross-sectional diagram illustrating a method of forming a preliminary etching mask pattern on the structure of FIG. 3D according to another embodiment of the invention.

Referring to FIG. 3E, the portion of the anti-reflective layer 214 is etched using the photoresist pattern 216 as an etching mask, thereby forming a preliminary etching mask pattern 218 that exposes the polysilicon film 212. The preliminary etching mask pattern 218 includes an anti-reflective layer pattern 214a and the photoresist pattern 216.

Figure 3F:
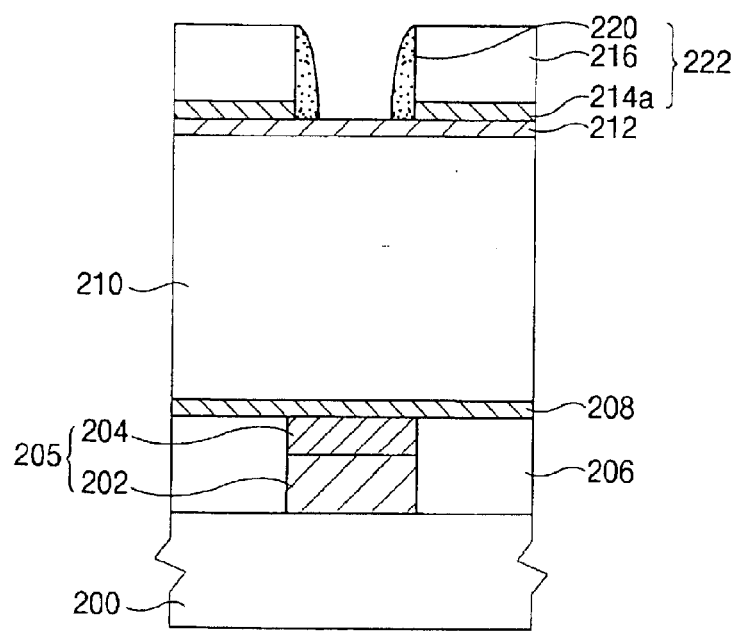
FIG. 3F is a cross-sectional diagram illustrating a method of forming a polymer on a sidewall of the preliminary etching mask pattern of FIG. 3E according to another embodiment of the invention.

Referring to FIG. 3F, the polymer 220 is attached to the sidewall of the preliminary etching mask pattern 218, such that an etching mask pattern 222 is formed. The etching mask pattern 222 narrows the opening to the polysilicon film 212 made previously by the photoresist pattern 216.

In the process for attaching the polymer 220 on the sidewall of the preliminary etching mask pattern 218, a gas containing CH$_x$F$_y$ (wherein x and y are positive numbers) or a mixture of gas including the gas of CH$_x$F$_y$ is flowed onto the substrate 200 where the preliminary etching mask pattern 218 is formed. The CH$_x$F$_y$ can include, for example, a CH$_2$F$_2$ gas, a CH$_2$F$_3$ gas, or a CHF$_3$ gas. Also, the mixture of gas can include a HeO$_2$ gas or a Cl$_2$ gas. When the process for attaching the polymer 220 is performed with the above-mentioned gas, the polymer 220 can be attached to the sidewall of the preliminary etching mask pattern 218 with hardly any etching of the exposed polysilicon film 212. Thus, the process time for attaching the polymer 220 can be advantageously controlled so that the polymer 220 has a desired thickness because the polysilicon film 212 is not etched during the process for attaching the polymer 220 to the sidewall of the preliminary etching mask pattern 218.

Figure 3G:
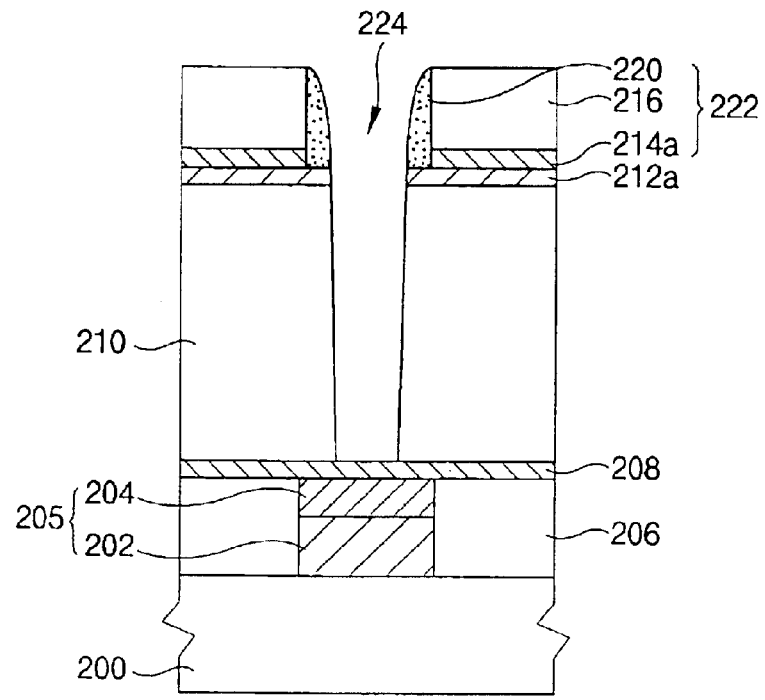
FIG. 3G is a cross-sectional diagram illustrating a method of forming a preliminary contact hole in the structure of FIG. 3F according to another embodiment of the invention.

Referring to FIG. 3G, the portions of the polysilicon film 212a and the interlayer dielectric film 210 are successively etched by using the etching mask pattern 222 (FIG. 3F) until the etching stop layer 208 is exposed. Thus, a preliminary contact hole 224 is formed to partially expose the etching stop layer 208. In this case, the preliminary contact hole 224 has a smaller diameter than the one made by the photoresist pattern 216 as shown in FIG. 3D.

Figure 3H:
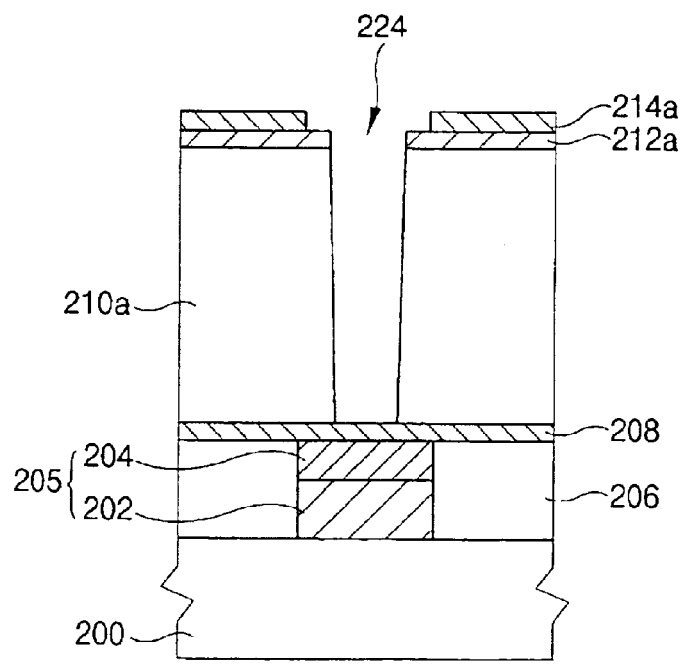
FIG. 3H is a cross-sectional diagram illustrating a method of removing a photoresist pattern and the polymer from the structure of FIG. 3G according to another embodiment of the invention.
Figure 3I:
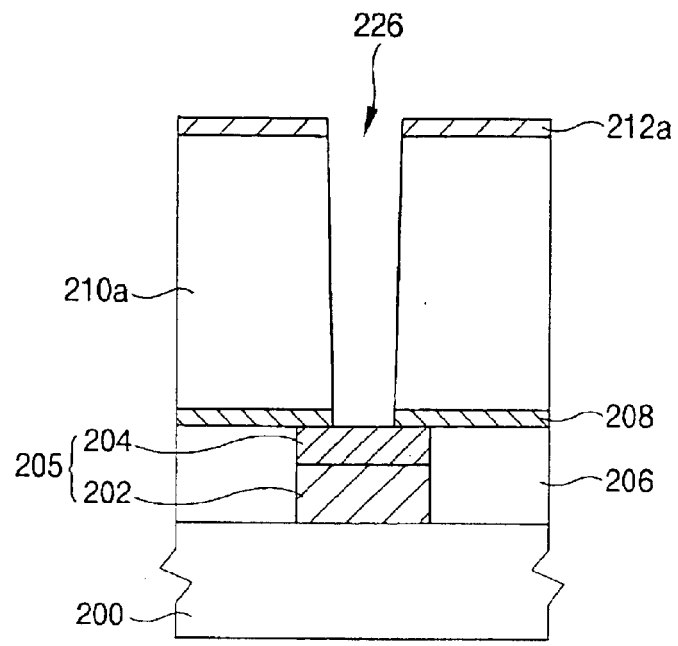
FIG. 3I is a cross-sectional diagram illustrating a method of forming a contact hole in the structure of FIG. 3H according to another embodiment of the invention.

Referring to FIG. 3H, the photoresist pattern 216 and the polymer 220 attached on the sidewall of the preliminary etching mask pattern 218 are removed through the ashing process. Referring to FIG. 3I, the exposed etching stop layer 208 and the anti-reflective layer 214a on the polysilicon film 212a are simultaneously etched such that a contact hole 226 is formed to expose the upper face of the metal silicide film 204. The exposed etching stop layer 208 is completely removed while the anti-reflective layer 214a may be completely etched or partially etched to remain on the polysilicon film 212a by a predetermined thickness. As shown in FIG. 3I, the anti-reflective layer 214a is completely removed.

Figure 3J:
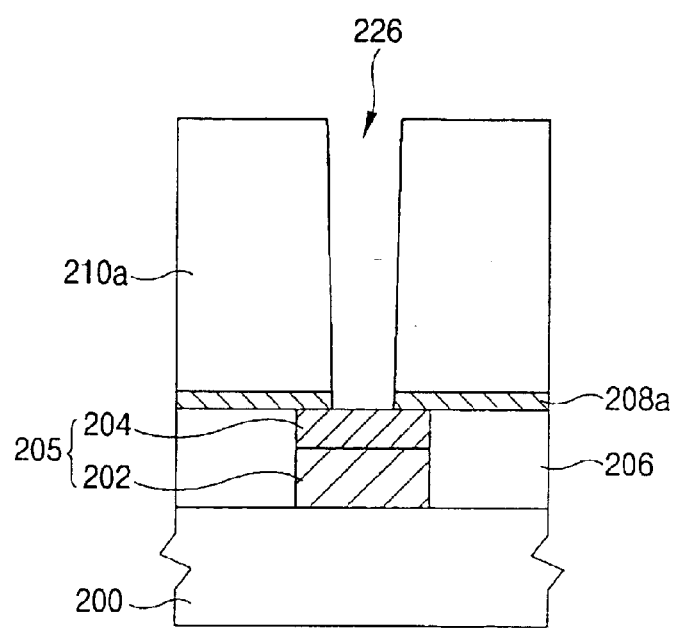
FIG. 3J is a cross-sectional diagram illustrating a method of removing the overlying films from the interlayer dielectric film of the structure of FIG. 3I according to another embodiment of the invention.

Referring to FIG. 3J, the overlying films on the interlayer dielectric film 210a are entirely removed such that the interlayer dielectric film 210a is exposed. When the anti-reflective layer 214a remains on the polysilicon film 212a, the anti-reflective layer 214a and the polysilicon film 212a are successively removed in the same etching process. Otherwise, the polysilicon film 212a is removed after the anti-reflective layer 214a is completely removed during the prior etching process.

In the case where the polysilicon film 212a is etched, the metal silicide film 204 exposed through the contact hole 226 may be damaged by the etch. Thus, the metal silicide film 204 should be not etched during the etching of the polysilicon film 212a. Generally, during the etching process, a loading effect may occur so that the etching rate of the region where patterns are closely disposed is faster than that of the region where the patterns are normally disposed. By maximizing the loading effect, the polysilicon film 212a on the interlayer dielectric film 210a may be etched faster than the metal silicide film 204 exposed through the contact hole 226. Specifically, the etching process is executed at a high pressure of no less than approximately 200 mTorr in order to augment the loading effect. Therefore, the damage to the metal silicide film 204 can be minimized during etching of the polysilicon film 212a.

In this embodiment, because the portion for the formation of the contact is exposed through the contact hole 226 when the polysilicon film 212a is etched, the portion for the formation of the contact does not advantageously include polysilicon.

Figure 3K:
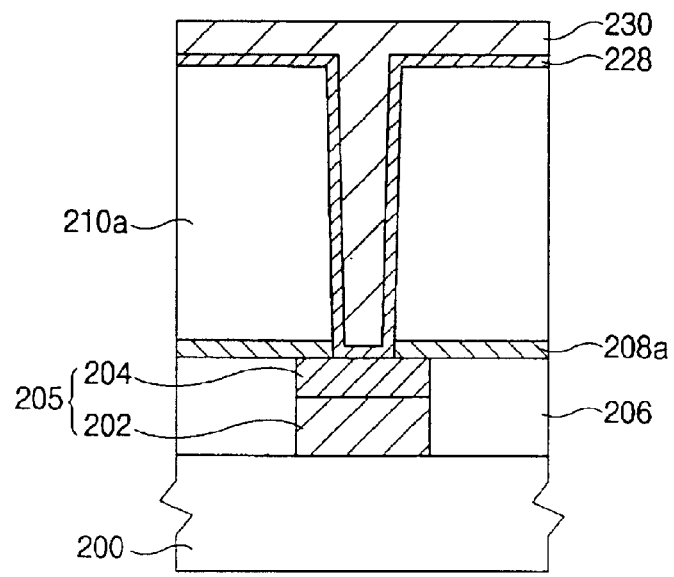
FIG. 3K is a cross-sectional diagram illustrating a method of forming a barrier metal layer on the structure of FIG. 3J according to another embodiment of the invention.

Referring to FIG. 3K, a barrier metal layer 228 is uniformly formed on the surfaces of the contact hole 226 and the interlayer dielectric film 210a. The barrier metal layer 228 prevents a conductive material filled in the contact hole 226 from diffusing into the interlayer dielectric film 210a. The barrier metal layer 228 may be a titanium film, a titanium nitride film, a tantalum film, a tantalum nitride film or a composite of those materials.

Because the polysilicon film 212a is completely removed before the barrier metal layer 228, the barrier metal layer 228 is not reacted with the polysilicon film 212a. Therefore, compared to the earlier embodiment described previously, the reaction film is not formed at all during the formation of the barrier metal layer 228.

Then, a metal layer 230 is formed on the barrier metal layer 228 to fill up the contact hole 226. The metal layer 230 can include tungsten (W), aluminum (Al), or copper (Cu).

Figure 3L:
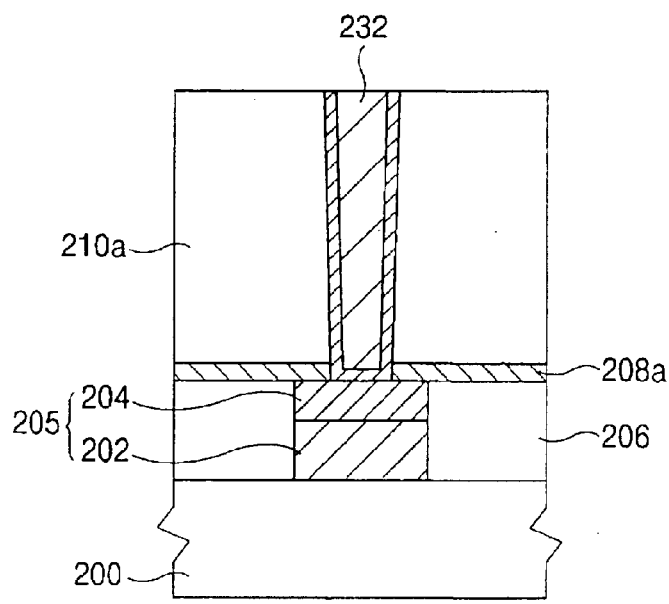
FIG. 3L is a cross-sectional diagram illustrating a method of polishing the structure of FIG. 3K according to another embodiment of the invention.

Referring to FIG. 3L, the metal layer 230 and the barrier metal layer 228 are successively polished until the interlayer dielectric film 210a is exposed. As a result, the contact 232 is formed from the portions of the metal layer 230 and the barrier metal layer 228 that fill in the contact hole 226. The interlayer dielectric film 210a insulates the contact from adjacent contact.

The metal layer 230 and the barrier metal layer 228 can be polished through a chemical-mechanical polishing (CMP) process. Also, the dry etching process can be performed on the metal layer 230 and the barrier metal layer 228 with the etching rate of the metal layer 230 identical to that of the barrier metal layer 228.

According to the embodiments of the invention described above, the contact can be formed to have a much smaller size than that of the opened region of the photoresist pattern produced through the photolithography process. Hence, the contact of the present invention has a smaller dimension than that of the contact provided by the conventional method. When the size of the contact is reduced, the process failures are minimized in accordance with the augmentation of the contact mis-alignment margin. In other words, as the dimension of the contact is reduced, any misalignment between the contact and the underlying conductive pattern 205 becomes less important. Additionally, a bridge failure between adjacent contacts can be decreased in accordance with the reduction in size of the contact. Furthermore, a reaction film between the metal silicide film and the polysilicon film is hardly generated during the formation of the contact.

Figure 4:
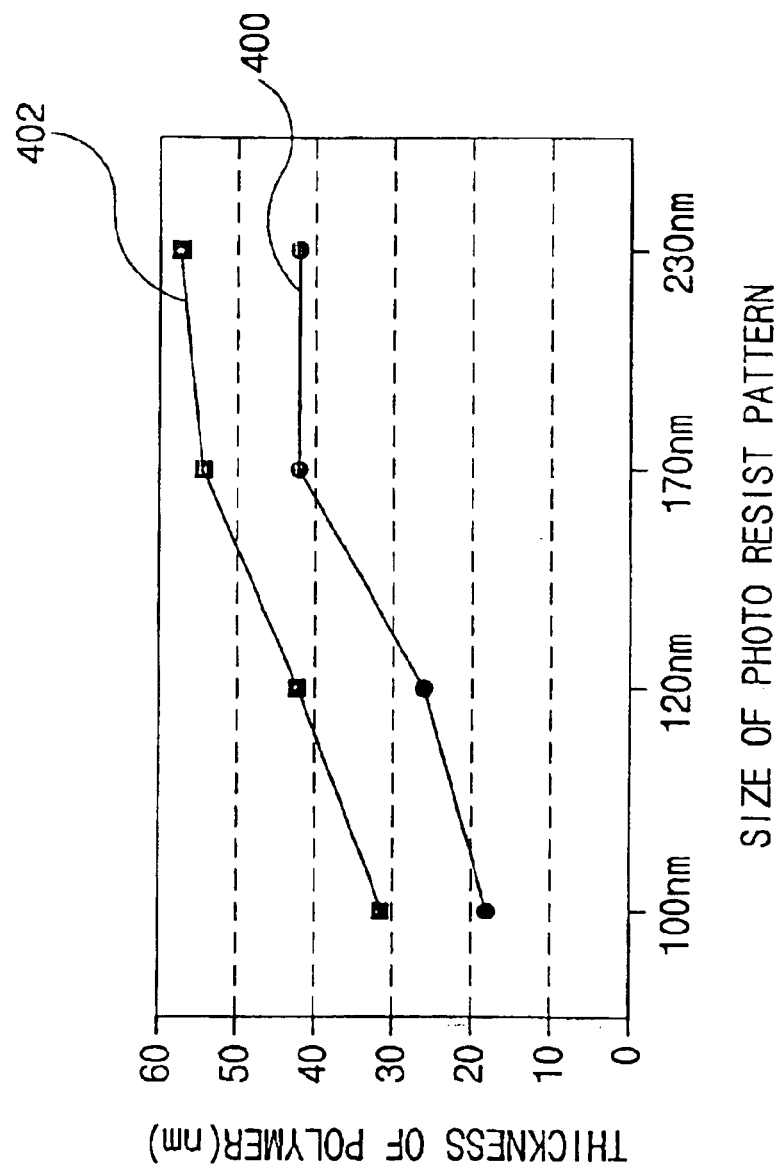
FIG. 4 is a graph illustrating the thickness of a polymer relative to a photoresist pattern including opened portions with various sizes according to some embodiments of the invention.

FIG. 4 is a graph that plots the thickness of the polymers attached to the photoresist patterns relative to the sizes of the photoresist patterns. In FIG. 4, the thicknesses of the polymers were measured after the polymers were attached to the sidewalls of the photoresist patterns with sizes between approximately 100 nm and 230 nm. The reference numeral 400 represents the thickness of the polymers attached to the photoresist patterns after the process for attaching the polymers for approximately 30 seconds, and the reference numeral 402 shows the thickness of the polymers attached to the photoresist patterns after the process for attaching the polymers for approximately 60 seconds.

As shown in FIG. 4, the thickness of the polymer increases as the process time for attaching the polymer increases. In addition, the thickness of the polymers increases in accordance with the dimension augmentation of the opened portions of the photoresist patterns even though the processes for attaching the polymers are executed for an identical time. On the other hand, the size of the contact hole is reduced in proportion to the increase in the thickness of the polymer.

Therefore, the etching mask pattern completed by attachment of the polymer is uniformly formed even though the photoresist pattern has irregular opened portions formed before the polymer attachment process. That is, the final etching mask pattern is uniform because polymer that is relatively thick can be attached to the portion of the photoresist having an opened portion of relatively wide size. As a result, the contact hole is formed with a uniform size.

As described above, according to embodiments of the invention, a contact hole can have a smaller size than that of the contact provided by conventional photolithography processes. Therefore, process failures are reduced because the size of the contact is decreased while the contact mis-alignment margin is augmented. In other words, as the dimension of the contact is reduced, any misalignment between the contact and the underlying conductive pattern 205 becomes less important. The failure of bridges between adjacent contacts can also be reduced.

The film generated from the reaction between polysilicon film and metal during the formation of then contact is minimal. Hence, process failures caused by the film can be decreased.

Furthermore, the contact hole has a uniform size even though the photoresist pattern has partially irregular opened portions.

Although only a few embodiments of the invention have been described, it is understood that the invention should not be limited to these embodiments but various changes and modifications can be made by one skilled in the art within the spirit and scope of the present invention as hereinafter claimed.

What is claimed is:

1. A method for forming a contact of a semiconductor device comprising the processes of:

i) forming an interlayer dielectric film on a semiconductor substrate including a contact formation portion;

ii) successively forming a polysilicon film and an anti-reflective layer on the interlayer dielectric film;

iii) forming a first mask pattern on the anti-reflective layer, the first mask pattern including a first opened portion corresponding to the contact formation portion;

iv) forming a second mask pattern exposing the polysilicon film by etching the anti-reflective layer exposed through the first mask pattern;

v) forming a third mask pattern by attaching polymer on a sidewall of the second mask pattern, the third mask pattern including a second opened portion smaller than the first opened portion;

vi) forming a contact hole exposing the contact formation portion by etching the polysilicon film and the interlayer dielectric film using the third mask pattern as an etching mask; and vii) filling the contact hole with a conductive material.

2. The method of claim 1, the process i) further comprising the process of forming an etching stop layer on the semiconductor substrate before forming the interlayer dielectric film.

3. The method of claim 2, wherein the etching stop layer includes a silicon nitride film.

4. The method of claim 2, wherein the anti-reflective layer is thicker than the etching stop layer so that the anti-reflective layer remains on the polysilicon film after etching the etching stop layer.

5. The method of claim 2, the process vi) further comprising the processes of:

removing the second mask pattern after etching the polysilicon film and the interlayer dielectric film; and simultaneously etching a portion of the anti-reflective layer and an entire exposed portion of the etching stop layer to form the contact hole.

6. The method of claim 1, the process vi) further comprising the processes of:

removing the second mask pattern after etching the polysilicon film and the interlayer dielectric film; and partially etching the anti-reflective layer so that a portion of the anti-reflective layer remains on the polysilicon film.

7. The method of claim 1, wherein the anti-reflective layer includes a silicon oxy-nitride film.

8. The method of claim 1, wherein the anti-reflective layer has a thickness of approximately 30 to 1,500 Å.

9. The method of claim 1, wherein the first mask pattern includes photoresist.

10. The method of claim 1, wherein the polysilicon film has a thickness of approximately 100 to 2,000 Å.

11. The method of claim 1, wherein the polymer is formed by providing a gas of $CH_xF_y$, or a mixture of gas including a gas of $CH_xF_y$ on the semiconductor substrate, wherein x and y are positive numbers.

12. The method of claim 11, wherein the gas of $CH_xF_y$ is chosen from the group consisting of a $CH_2F_2$ gas, a $CH_3F$ gas, and a $CHF_3$ gas.

13. The method of claim 11, wherein the mixture of gas including the gas of $CH_xF_y$ comprises a $HeO_2$ gas and a $Cl_2$ gas.

14. The method of claim 1, the process vii) further comprising the processes of:

forming a barrier metal layer on surfaces of the contact hole and the interlayer dielectric film;

forming a metal layer on the barrier metal layer to fill the contact hole;

polishing the metal layer and the barrier metal layer to expose the polysilicon film; and dry etching the polysilicon film.

15. The method of claim 14, wherein a polishing rate of the metal layer is at least ten times faster than that of the polysilicon film.

16. The method of claim 14, wherein an etching rate of the polysilicon film is at least five times faster than that of the metal layer.

17. The method of claim 14, wherein the polysilicon film is etched using a gas comprising $Cl_2$ and HBr.

18. The method of claim 14, wherein the barrier metal layer is at least one selected from the group consisting of a titanium film, a titanium nitride film, a tantalum film, and a tantalum nitride film.

19. The method of claim 1, the process vii) further comprising the processes of:

forming a barrier metal layer on surfaces of the contact hole and the interlayer dielectric film;

forming a metal layer on the barrier metal layer that fills the contact hole; and etching the metal layer, the barrier metal layer and the polysilicon film, wherein etching rates of the metal layer, the barrier metal layer and the polysilicon film are substantially identical to one another.

20. The method of claim 1, further comprising the process of removing films on the interlayer dielectric film after forming the contact hole.

21. The method of claim 20, wherein the films on the interlayer dielectric film are removed at a pressure of no less than approximately 200 mTorr.

22. The method of claim 1, wherein the contact formation portion is chosen from the group consisting of a metal silicide film, a silicon film, and a metal film.

23. A method for forming a contact of a semiconductor device comprising the processes of:

i) successively forming an etching stop layer and an interlayer dielectric film on a semiconductor substrate including a contact formation portion;

ii) successively forming a polysilicon film and an anti-reflective layer on the interlayer dielectric film;

iii) forming a first mask pattern on the anti-reflective layer, the first mask pattern including a first opened portion corresponding to the contact formation portion;

iv) forming a second mask pattern exposing the polysilicon film by etching the anti-reflective layer exposed through the first mask pattern;

v) forming a third mask pattern by attaching polymer on a sidewall of the second mask pattern, the third mask pattern including a second opened portion smaller than the first opened portion;

vi) etching the polysilicon film and the interlayer dielectric film using the third mask pattern as an etching mask to expose the etching stop layer;

vii) forming a contact hole exposing the contact formation portion by etching the exposed etching stop layer while the anti-reflective layer remains on the polysilicon film; and viii) filling the contact hole with a conductive material.

24. The method of claim 23, the process viii) further comprising the processes of:

forming a barrier metal layer on surfaces of the contact hole and the interlayer dielectric film;

covering the contact hole by forming a metal layer on the barrier metal layer;

exposing the polysilicon film by polishing the metal layer and the barrier metal layer; and dry etching the polysilicon film.

25. The method of claim 23, the process viii) further comprising the processes of:

forming a barrier metal layer on surfaces of the contact hole and the interlayer dielectric film;

filling the contact hole by forming a metal layer on the barrier metal layer; and etching the metal layer, the barrier metal layer, and the polysilicon film wherein etching rates of the metal layer, the barrier metal layer, and the polysilicon film are substantially identical to one another.

26. A method for forming a contact of a semiconductor device comprising the processes of:
  i) forming an interlayer dielectric film on a semiconductor substrate including a contact formation portion;
  ii) successively forming a polysilicon film and an anti-reflective layer on the interlayer dielectric film;
  iii) forming a first mask pattern on the anti-reflective layer, the first mask pattern including a first opened portion corresponding to the contact formation portion;
  iv) forming a second mask pattern exposing the polysilicon film by etching the anti-reflective layer exposed through the first mask pattern;
  v) forming a third mask pattern by attaching polymer on a sidewall of the second mask pattern, the third mask pattern including a second opened portion smaller than the first opened portion;
  vi) forming a contact hole exposing the contact formation portion by etching the polysilicon film and the interlayer dielectric film using the third mask pattern as an etching mask to expose the etching stop layer;
  vii) removing films on the interlayer dielectric film; and
  viii) filling the contact hole with a conductive material.

27. The method of claim 26, the process i) further comprising the process of forming an etching stop layer on the semiconductor substrate before forming the interlayer dielectric film.

28. The method of claim 26, wherein the films on the interlayer dielectric film are removed at a pressure of more than approximately 200 mTorr during process vii).

29. The method of claim 26, the process viii) further comprising the processes of:
  forming a barrier metal layer on surfaces of the contact hole and the interlayer dielectric film;
  filling the contact hole by forming a metal layer on the barrier metal layer; and
  exposing the interlayer dielectric film by polishing the metal layer and the barrier metal layer.

30. The method of claim 29, wherein the barrier metal layer is at least one selected from the group consisting of a titanium film, a titanium nitride film, a tantalum film, and a tantalum nitride film.

31. The method of claim 26, wherein the process viii) further comprises the process of:
  forming a barrier metal layer on surfaces of the contact hole and the interlayer dielectric film;
  filling the contact hole by forming a metal layer on the barrier metal layer; and
  etching the metal layer, the barrier metal layer, and the polysilicon film wherein etching rates of the metal layer, the barrier metal layer and the polysilicon film are substantially identical to one another.

32. The method of claim 27, wherein the contact formation portion includes one chosen from the group consisting of a metal silicide film, a silicon film, and a metal film.

* * * * *

UNITED STATES PATENT AND TRADEMARK OFFICE
CERTIFICATE OF CORRECTION

PATENT NO. : 6,815,335 B2
DATED : November 9, 2004
INVENTOR(S) : Hwang et al.

It is certified that error appears in the above-identified patent and that said Letters Patent is hereby corrected as shown below:

Column 4,
Line 7, replace "forming etching stop" with -- forming an etching stop --.
Line 12, replace "of the invention" with -- of the invention. --.
Line 13, replace "forming anti-reflective" with -- forming an anti-reflective --.
Line 38, replace "of FIG. 21" with -- of FIG. 2I --.
Line 44, replace "of forming etching" with -- of forming an etching --.
Line 52, replace "of forming anti-reflective" with -- of forming an anti-reflective --.

Column 5,
Line 2, replace "removing a photoresist" with -- removing the photoresist --.

Column 8,
Line 4, replace "to FIG. 21," with -- FIG. 2I, --.

Signed and Sealed this

Seventh Day of February, 2006

JON W. DUDAS
*Director of the United States Patent and Trademark Office*